United States Patent [19]

Yamagishi et al.

[11] Patent Number: 5,126,113
[45] Date of Patent: Jun. 30, 1992

[54] APPARATUS FOR PRODUCING CZOCHRALSKI-GROWN SINGLE CRYSTALS

[75] Inventors: Hirotoshi Yamagishi; Kouji Mizuishi, both of Annaka; Fumihiko Hasegawa, Urawa, all of Japan

[73] Assignee: Shin-Etsu Handotai Co., Ltd., Tokyo, Japan

[21] Appl. No.: 677,172

[22] Filed: Mar. 29, 1991

[30] Foreign Application Priority Data

Mar. 30, 1990 [JP] Japan ................................ 2-86989
Apr. 11, 1990 [JP] Japan ................................ 2-95871

[51] Int. Cl.$^5$ ............................................. B01D 9/00
[52] U.S. Cl. .............................. 422/249; 156/617.1; 156/620.73; 156/620.74; 156/620.75; 156/DIG. 98; 422/250
[58] Field of Search ........... 156/617.1, 620.73, 620.74, 156/620.75, DIG. 98; 422/250

[56] References Cited

U.S. PATENT DOCUMENTS

| 788,142 | 4/1905 | Pease | 156/617.1 |
| 3,511,609 | 1/1967 | Kato | 156/617.1 |
| 3,607,138 | 9/1971 | Keller | 422/250 |
| 4,176,002 | 11/1979 | Quenisset et al. | 422/249 |
| 4,284,605 | 8/1981 | Pierrat | 422/249 |

FOREIGN PATENT DOCUMENTS 0369626 10/1989 European Pat. Off.
63-252991 10/1988 Japan.

OTHER PUBLICATIONS

European Search Report Reference No. EP-7058-30-/iw.

Primary Examiner—Robert Kunemund
Assistant Examiner—Felisa Garrett
Attorney, Agent, or Firm—Nikaido, Marmelstein, Murray & Oram

[57] ABSTRACT

An apparatus for producing a single crystal ingot grown by the Czochralski method includes a plurality of grip arms each having a grip finger engageable with a downwardly facing engagement step formed on an upper part of the single crystal, and a ring slidably fitted around a plurality of grip arms to hold the grip arms in a closed position in which the engagement step of the single crystal is firmly gripped by the grip fingers against detachment. The apparatus having such a ring is particularly advantageous when used for the production of a heavy single crystal ingot in which the grip arms are forced to spread apart by the weight of the single crystal ingot.

7 Claims, 6 Drawing Sheets

FIG. 1
FIG. 2
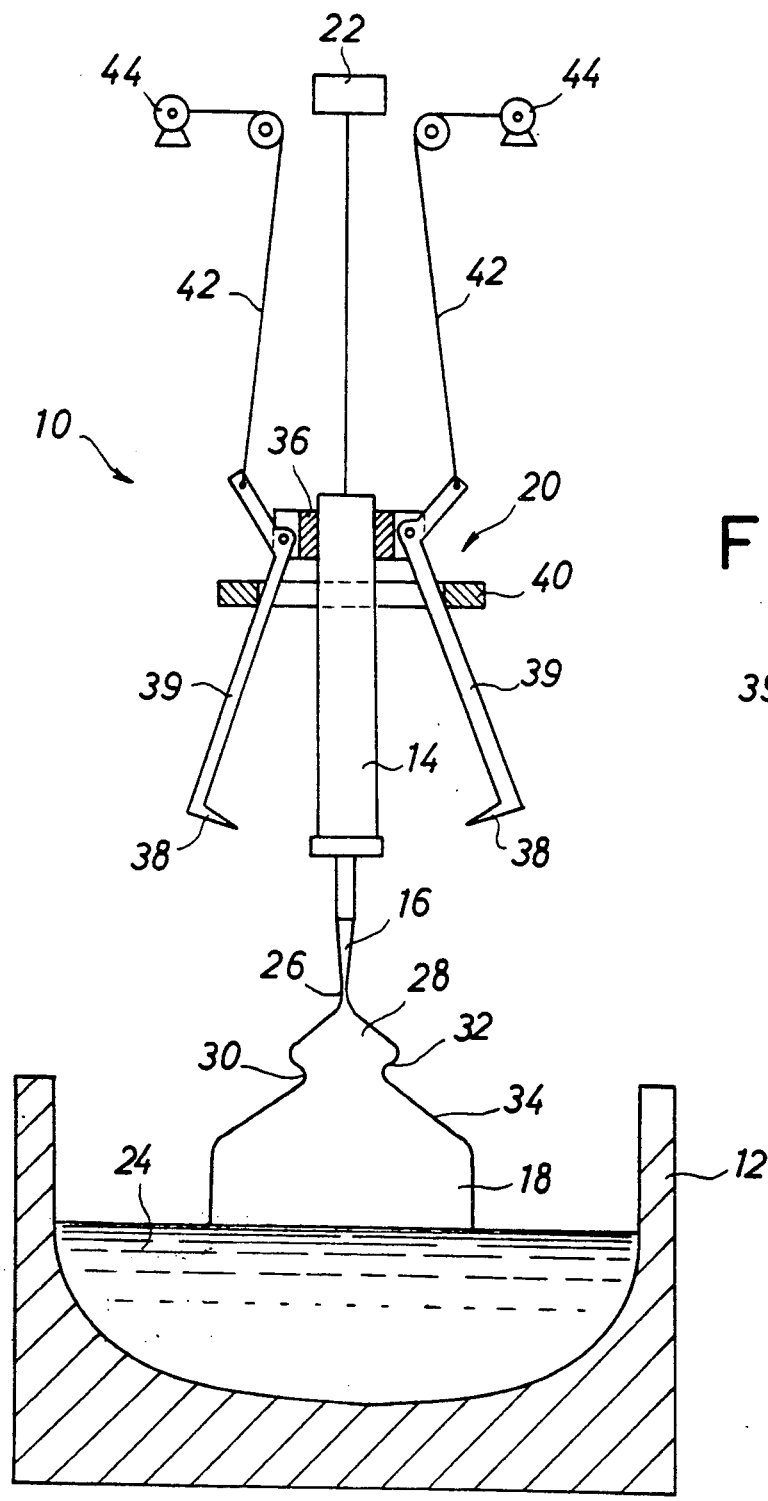
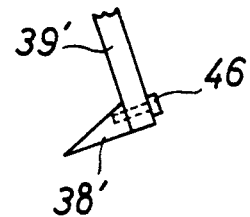

APPARATUS FOR PRODUCING CZOCHRALSKI-GROWN SINGLE CRYSTALS

BACKGROUND OF THE INVENTION

1. Field of the Invention

The present invention relates to an apparatus for producing single crystals, such as single crystal silicon ingots, grown by the Czochralski (CZ) method also known as the pulling method. More particularly, it relates to such an apparatus which is capable of producing a large-diameter, heavy Czochralski-grown single crystal with safety.

2. Description of the Prior Art

In the production of single crystals, such as single crystal silicons, grown by the Czochralski (CZ) method, polycrystalline silicon powder is melted down within a quartz crucible heated in a chamber by resistance heating or high frequency heating. After a seed crystal is attached to the lower end of a pull shaft or a pull wire disposed above the quartz crucible, the pull shaft or the pull wire is covered to dip or immerse the seed crystal into a melt of polycrystalline silicon. Subsequently, the seed crystal is slowly pulled up from the silicon melt while rotating at a predetermined speed, thus producing a single crystal silicon ingot grown by the CZ method.

The conventional single crystal ingot thus produced has a diameter of 5–6 inches (12.55–15.24 cm) and a weight of 20–30 kg. In recent years, with a view to improving the yield of the grown single crystal and the production efficiency of semiconductors from the crystal, there has been a growing tendency toward producing a single crystal ingot which is larger in diameter (more than 7 inches (17.78 cm), for example) and longer in length than conventional single crystal ingots. The weight of such larger-diameter and longer single crystal ingots sometimes exceeds 100 kg.

When a single crystal ingot is being pulled, the weight of the single crystal ingot is sustained by a seed crystal ingot and a small-diameter Dash's neck contiguous to the seed crystal. Since the Dash's neck is only 1–4 mm in diameter, it has a limited capability of withstanding a load exerted thereon. Consequently, the Dash's neck is likely to be broken when subjected to a small twisting force or an impact while the single crystal ingot is being grown or during the handling operation of the single crystal ingot. A break in the Dash's neck would cause various accidents such the destruction of a single crystal producing apparatus, the flooding of a polycrystalline melt, or a phreatic explosion which might result in injury or death.

In order to avert danger, an attempts have been made to use large-diameter head and small-diameter neck formed in succession on an upper part of a large-diameter, heavy single crystal ingots being grown so as to provide a downwardly facing engagement step. The stepped upper part of the single crystal ingot being grown is gripped by a plurality of clamp arms (grip means) each having a hook-shaped clamp finger lockingly engageable with the engagement step or by a plurality of vertically movable shafts (grip means) each having a locking projection engageable with the engagement step. Thus, the weight of the large-diameter, heavy single crystal ingot being grown is sustained by the stepped upper part which is considerably larger in diameter than the Dash's neck and hence is capable of withstanding by far a larger load than the Dash's neck.

The foregoing attempt is disclosed in Japanese Patent Laid-open Publication Nos. 55-167200, 62-288191 and 63-252991.

The foregoing attempt is not satisfactory because the grip means fails to hold the engagement step in a stable and reliable manner. More specifically, when a very heavy single crystal ingot having a weight over 100 kg is being pulled, the grip means yields to the weight of the single crystal ingot and tends to spread radially and outwardly with the result that the single crystal ingot detaches from the grip means.

Furthermore, the stepped upper portion of the single crystal ingot including the engagement step is sometimes formed asymmetrically about a longitudinal axis of the single crystal ingot. Such an asymmetric engagement step cannot be held stably and reliably by the grip means, and due to unequal sharing of the weight of the single crystal ingot among the grip means, the single crystal detaches from the grip means. In this instance, a dangerous accident such as destruction of the single crystal ingot producing apparatus may occur.

SUMMARY OF THE INVENTION

With the foregoing drawbacks of the prior art in view, it is a general object of the present invention to provide an apparatus for producing a large-diameter, heavy Czochralski-grown single crystal ingot in safety.

A more specific object of the present invention is to provide a single crystal ingot producing apparatus including structural features which are capable of stably and reliably holding an engagement step of such large-diameter, heavy single crystal ingots.

According to a first aspect of the present invention, there is provided an apparatus for producing a single crystal ingot grown from a seed crystal by the Czochralski method that includes: means for forming a large-diameter head and a small-diameter neck in succession so as to provide a downwardly facing engagement step on an upper part of a single crystal to be grown from the seed crystal; means for gripping the upper part of the single crystal ingot being grown, the gripping means including a plurality of circumferentially spaced grip arms each having a grip finger releasably engageable with the engagement portion of the single crystal ingot to hook the latter, the grip arms being vertically movable to move the respective grip fingers toward and away from each other; and means for holding the gripping means in a position to grip the upper portion of the single crystal reliably against detachment.

After the engagement step is formed on an upper portion of the single crystal, the grip arms move downward by their own weight whereupon the grip fingers of the respective grip arms move inwardly toward each other to hook the engagement step of the single crystal ingot. During that time, the holding means comprising a ring slides down along the grip arms by its own weight, thus holding the grip arms in a position to firmly grip the upper portion of the single crystal ingot against detachment.

Each of the grip arms is an L-shaped lever and the grip finger is formed integrally with a lower end of the grip arm. The grip finger may be detachably connected to the lower end of the grip arm, in which instance the grip finger is preferably made of silicon carbide or silicon nitride to prevent the single crystal ingot from contamination. The holding means comprises a ring slidably fitted around the gripping arms and vertically movable relative to the gripping arms. The ring is simple in construction and can reliably hold the grip arms in a closed position.

According to a preferred embodiment, the grip arms are vertically movable separately from one another so as to enable the grip fingers to conform to the shape of the engagement step even when the engagement step is asymmetric about a longitudinal axis of the single crystal ingot. The independently movable grip arms insures a stable and reliable interlocking engagement between the grip fingers and the engagement step of the single crystal ingot.

According to a second aspect of the present invention, there is provided an apparatus for producing a single crystal ingot grown from a seed crystal by Czochralski method that incorporates: means for forming a large-diameter head and a small-diameter neck in succession so as to provide a downwardly facing engagement step on an upper part of a single crystal ingot to be grown from the seed crystal; and means for gripping the upper part of the single crystal ingot being grown. The gripping means includes a power-driven cylindrical rotor disposed vertically and having an external thread on its outer peripheral surface, a tubular holder having on its inner peripheral surface an internal thread threaded over the external thread, the tubular holder being non-rotatable and vertically movable in response to rotation of the rotor, a plurality of circumferentially spaced grip fingers pivotally connected to a lower end of the tubular holder and releasably engageable with the engagement portion of the single crystal to hook the latter, and means for preventing the grip fingers from pivoting in a downward direction beyond a predetermined angle.

The preventing means has a plurality of stoppers projecting radially inwardly from the lower end of the tubular holder and engageable with corresponding ones of the grip fingers when the grip fingers pivot downward. The number of the grip fingers is preferably three, the three grip fingers being circumferentially spaced at equal intervals.

It is preferable that at least a distal end of each of the grip fingers is made of molybdenum so as to protect the single crystal ingot from contamination.

The rotor is driven by an electric motor which is controlled with utmost ease by a receiver accepting infrared radiation signals or ultrasonic signals transmitted from a remote control commander or transmitter.

According to a third aspect of the present invention, there is provided an apparatus for producing a single crystal ingot grown from a seed crystal by Czochralski method, that includes: means for forming a large-diameter head and a small-diameter neck in succession so as to provide a downwardly facing engagement step on an upper part of a single crystal ingot to be grown from the seed crystal; and means for gripping the upper part of the single crystal ingot being grown. The gripping means includes a plurality of circumferentially spaced, vertical elongate holders each having a support portion, a plurality of grip fingers pivotally connected to lower ends of the holders, respectively, and releasably engageable with the engagement portion of the single crystal ingot to hook the latter, means for preventing the grip fingers from pivoting in a downward direction beyond a predetermined angular range, a plurality of power-driven feed screws threaded through the support portions of the respective holders and rotatable to move the corresponding holders in a vertical direction, and a tubular guide member slidably receiving therein the holders while restricting radial outward movement of the holders, said guide member supporting thereon said feed screws. Since the holders are vertically movable separately from one another, the grip fingers are always held in stable engagement with the engagement step even when the engagement step is asymmetric about a longitudinal axis of the single crystal ingot.

Many other advantages and features of the present invention will become manifest to those versed in the art upon making reference to the detailed description and the accompanying sheets of drawings in which preferred structural embodiments incorporating the principles of the present invention are shown by way of illustrative example.

BRIEF DESCRIPTION OF THE DRAWINGS

FIG. 1 is a diagrammatic cross-sectional view of an apparatus for producing a Czochralski-grown single crystal ingot according to a first embodiment of the present invention;

FIG. 2 is a front elevational view showing a modified grip finger of the apparatus;

DETAILED DESCRIPTION OF THE INVENTION

Figure 3:
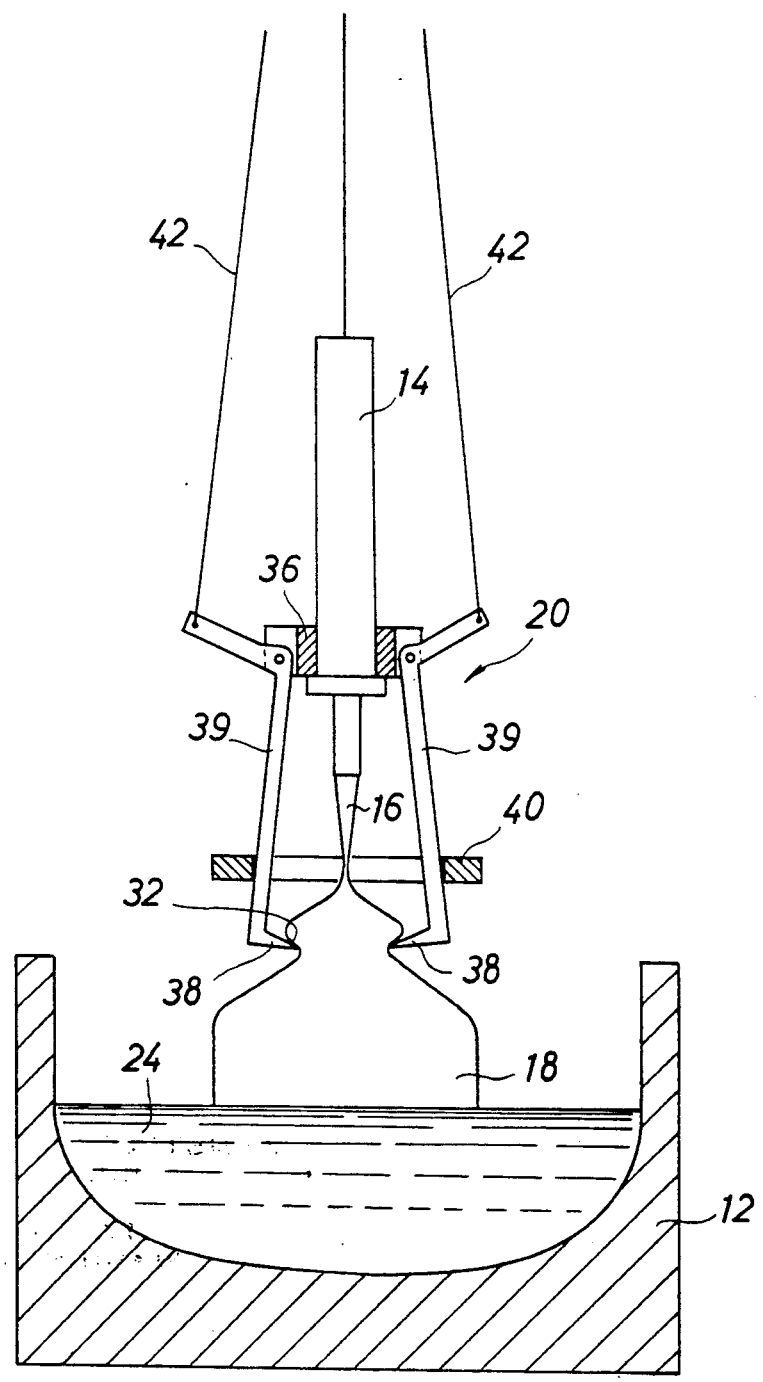
FIG. 3 is a view similar to FIG. 1, showing the apparatus as it is pulling the single crystal ingot.

Referring to the drawings, wherein like reference characters designate like or corresponding parts throughout the several views, FIGS. 1 and 3 diagrammatically show an apparatus 10 of this invention for producing a single crystal ingot grown by the Czochralski (CZ) method also known as pulling method.

The apparatus 10 includes a quartz crucible 12 and a seed holder 14 that are disposed in a chamber (not shown). The quartz crucible 12 is heated by a resistance heater or a high frequency heater which is disposed around the quartz crucible 12 for melting granular polycrystal in the quartz crucible 12.

The seed holder 14 is disposed above the quartz crucible 12 for holding a seed crystal 16 on its lower end. The seed holder 14 is connected with a pulling means 22 which is composed of a combined rotating-and-lifting mechanism. The seed crystal 16 is lowered by the pulling means 22 until its lower end is dipped or immersed into a melt 24 of polycrystal retained in the quartz crucible 12. Subsequently, the pulling means 22 gradually pulls the seed crystal 16 up from the polycrystalline melt 24 while rotating it, so that a Dash's neck 26 of a single crystal ingot 18 is grown first from the seed crystal 14. The Dash's neck 26 has a diameter considerably smaller than the diameter of the body of the single crystal ingot 18. To this end, during the initial stage of the pulling operation, the temperature of the melt 24 is set at a low level or alternatively the seed lift rate is set at a high level.

Subsequently, the seed lift rate is set at a low level whereby a large-diameter head 28 is formed immediately below the Dash's neck 26. Thereafter, the seed lift rate is changed to a higher level so as to form a small-diameter neck 30 contiguous to the head 28. The head 28 and the neck 30 jointly form a downwardly facing engagement step 32. Then, the seed lift rate is set at a lower level to form a conical shoulder 34 having a diameter which is the same as the desired diameter of a body of the single crystal ingot 18 to be grown. This seed lift rate is maintained so that the single crystal ingot 18 of the desired diameter is grown by the CZ method.

When the engagement step 32 is formed, a gripping means 20 of the apparatus 10 operates to hook the engagement step 32 and lift the single crystal ingot 18 in synchronism with the operation of the pulling means 22. The gripping means 20 includes a slide member 36 vertically movably mounted in the seed holder 14, and a plurality of circumferentially spaced grip arms 39 disposed vertically and pivoted on the slide member 36. Each of the grip arms 39 is composed of an L-shaped lever and has a grip finger 38 bent radially inwardly from a lower end of the grip arm 39. A ring 40 is slidably fitted around the grip arms 39 and vertically movable relative to the grip arms 39 for holding the grip arms 39 in a position to firmly grip the upper portion of the single crystal ingot 18 against detachment. The ring 40 is thus constitutes a holding means. The upper end of each grip arm 39 is connected via a wire 42 to an electric motor 44. For a stable lifting of the single crystal ingot 18, it is preferable that the number of the grip arms 39 is three or four. However, two or more than five grip arms may be used. The grip finger 38 is integral with the corresponding grip arm 39. The seed holder 14, the grip arms 39 and the ring 40 are made of molybdenum or molybdenum plated stainless steel. As shown in FIG. 2, it is possible to use a grip finger 38' which is detachably connected by a screw 46 to the lower end of a grip arm 39'. The grip finger 38 is preferably made of silicon carbide or silicon nitride so as to protect the single crystal ingot 18 against contamination.

The apparatus of the foregoing construction operates as follows. After an engagement step 32 is formed on an upper part of the single crystal ingot 18, the electric motors 44 are driven in a direction to unwind the wire 42. The slide member 36 and the grip arms 39 of the gripping means 20 fall by their own weight. In this instance, the grip arms 39 pivot in a direction to move the respective grip fingers 38 radially inwardly toward each other, thereby closing the lower end of the grip arms 39. In response to the pivotal movement of the grip arms 39, the ring 40 slide down along the grip arms 39 by its own weight. When the grip fingers 38 of the grip arms 39 are brought into engagement with the engagement step 32, as shown in FIG. 3, the electric motors 44 are driven in the opposite direction to tension the wire 42 whereupon the grip fingers 38 are caused to hook the engagement step 32. In this instance, the weight of the single crystal ingot retained by the grip arms 39 tends to spread the grip arms 39. However, the grip arm 39 is held in its closed position by means of the ring 40. The interlocking engagement between the engagement step 32 and the grip fingers 38 can, therefore, be maintained with the result that the upper portion of the single crystal 18 is firmly gripped by the grip arms 39 against detachment. Thereafter, the pulling means 22 and the electric motors 44 are driven in synchronism with each other to gradually lift the single crystal ingot 18 grown by the CZ method.

Figure 4:
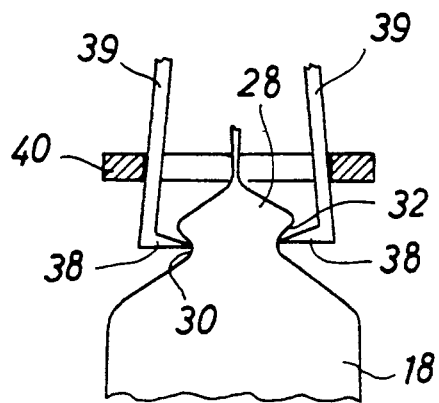
FIG. 4 is a fragmentary cross-sectional view of the apparatus as it is pulling a single crystal ingot having an upper end portion including an asymmetric engagement step.

During the formation of the engagement step 32, the head 28 and the neck 30 may be formed asymmetrically about a longitudinal axis of the single crystal ingot 18, as shown in FIG. 4. In this instance, the grip fingers 38 are no longer possible to uniformly grip the engagement portion 32. This means that the weight of the single crystal 18 is sustained only by a selected one or ones of the grip arms 39 and, due to uneven sharing of load, the selected grip arm or arms may finally be damaged or broken.

Figure 5:
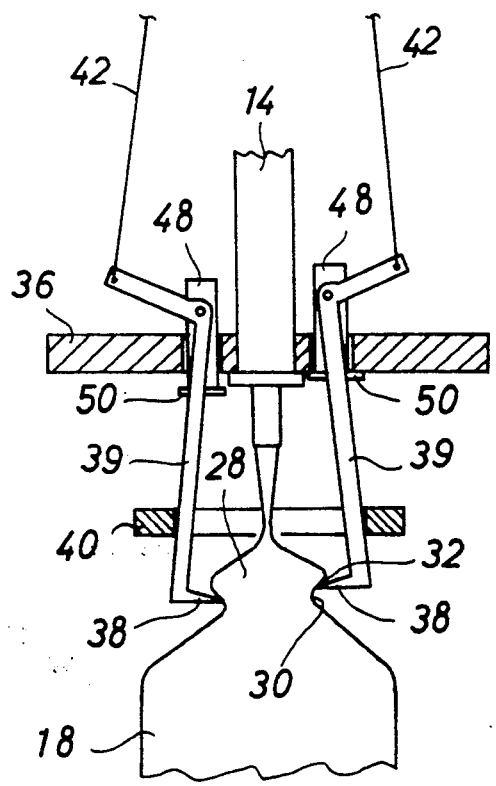
FIG. 5 is a fragmentary cross-sectional view of a single crystal producing apparatus according to a second embodiment of this invention.

The foregoing problem does not take place when a modified gripping means is used. The modified gripping means, as shown in FIG. 5, includes a plurality of grip arms 39 each of which is vertically movable relative to a slide member 36. The grip arms 39 are independently adjustable in their vertical position. To this end, the gripping means includes a plurality of sliders 48 vertically movably mounted on the slide member 36 and pivotally connected to the corresponding ones of the grip arms 39. If an engagement step 32 which is formed on an upper part of the single crystal ingot 18 is irregular in shape as shown in FIG. 5, the grip finger 38 of the left grip arm 39 is held in interlocking engagement with a left part of the irregularly shaped engagement step 32, while the grip finger 38 of the right grip arm 39 is held out of engagement with a light part of the irregularly shaped engagement step 32. In this instance, an electric motor (not shown but identical to the electric motor 44 shown in FIG. 1) which is operatively connected with the right grip arm 39 is driven to pull the right grip arm 38 upwardly via the slider 48 until the grip finger 38 of the right grip arm 38 engages the right part of the irregularly shaped engagement step 32. This adjustment of the vertical position of the grip arms 39 insures that the irregularly shaped engagement step 32 can be uniformly gripped by the grip fingers 38 of all grip arms 38. Then, the single crystal ingot 18 being grown is gradually pulled upwardly. With the gripping means having independently movable grip arms 39, a large-diameter, heavy single crystal ingot can be produced in safety even when an engagement step formed on an upper part of the single crystal is irregular in shape.

Figure 6:
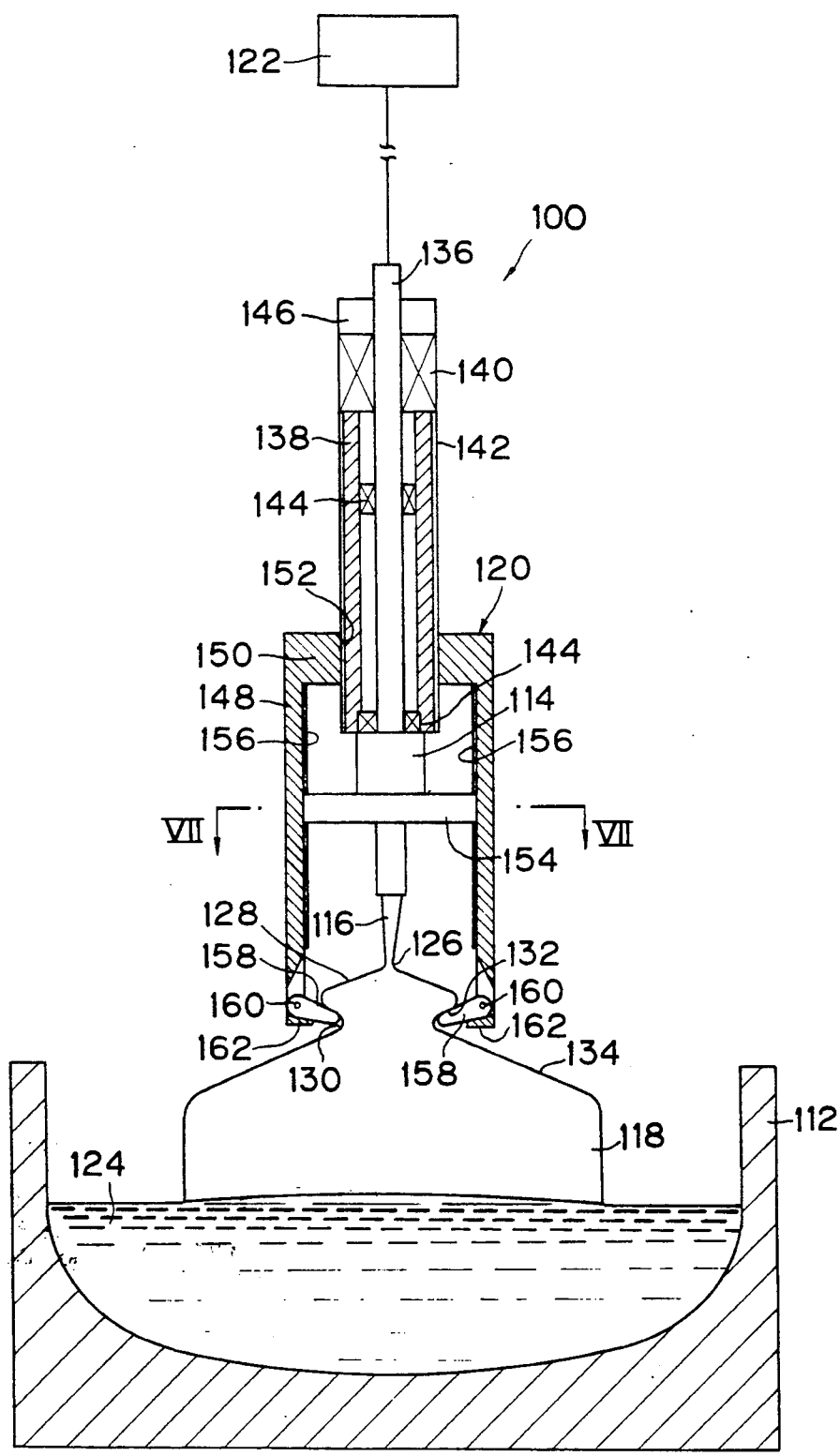
FIG. 6 is a diagrammatic cross-sectional view of an apparatus for producing a Czochralski-grown single crystal according to a third embodiment of this invention.

FIG. 6 shows an apparatus for producing a single crystal ingot grown by the CZ method according to a third embodiment of the present invention.

The apparatus 100 includes a quartz crucible 112 and a seed holder 114 that are disposed in a chamber (not shown). The quartz crucible 112 is heated by a resistance heater or a high frequency heater which is disposed around the quartz crucible 112 for melting granular polycrystal in the quartz crucible 112.

The seed holder 114 is disposed above the quartz crucible 112 for holding a seed crystal 116 on its lower end. The seed holder 114 is connected with a pulling means 122 which is composed of a combined rotating-and-lifting mechanism. The seed crystal 116 is lowered by the pulling means 122 until its lower end is dipped or immersed into a melt 124 of polycrystal retained in the quartz crucible 112. Subsequently, the pulling means 122 gradually pulls the seed crystal 116 up from the polycrystalline melt 124 while rotating it, so that a Dash's neck 126 of a single crystal ingot 118 is grown first from the seed crystal 114. The Dash's neck 126 has a diameter considerably smaller than the diameter of the body of the single crystal ingot 118. To this end, during the initial stage of the pulling operation, the temperature of the melt 124 is set at a low level or alternatively the seed lift rate is set at a high level.

Subsequently, the seed lift rate is set at a low level whereby a large-diameter head 128 is formed immediately below the Dash's neck 126. Thereafter, the seed lift rate is changed to a higher level so as to form a small-diameter neck 130 contiguous to the head 128. The head 128 and the neck 130 jointly form a downwardly facing engagement step 132. Then, the seed lift rate is set at a lower level to form a conical shoulder 134 having a diameter which is the same as the desired diameter of a body of the single crystal ingot 118 to be grown. This seed lift rate is maintained so that the single crystal ingot 118 of the desired diameter is grown by the CZ method.

When the engagement step 132 is formed, a gripping means 120 of the apparatus 10 operates to hook the engagement step 132 and lift the single crystal ingot 118 in synchronism with the operation of the pulling means 122. The gripping means 120 includes a cylindrical rotor 138 rotatable relative to a pull shaft 136 connected end-to-end with the seed holder 114, and an electric motor 140 for driving the rotor 138. The rotor 138 has an external thread 142 on its outer peripheral surface and is rotatably mounted on the pull shaft 136 via a pair of roller bearings 144. The motor 140 is associated with a receiver 146. The receiver 146 may be a photodetector accepting infrared radiation signals or a ultrasonic receiver accepting ultrasonic signals. The receiver 146 is activated when it receives infrared radiation signals or ultrasonic signals from a transmitter (not shown). The transmitter is preferably composed of a remote control commander or transmitter. When the infrared radiation signals are used, they must have a certain intensity to avoid malfunctioning of the motor 140 even when subjected to noises. The ultrasonic signals are preferable as they are resistant to noise. The receiver 146 preferably has a directivity in reception. With the receiver 146 thus provided, the motor 140 can be controlled from a distant point by the remote control commander.

Figure 7:
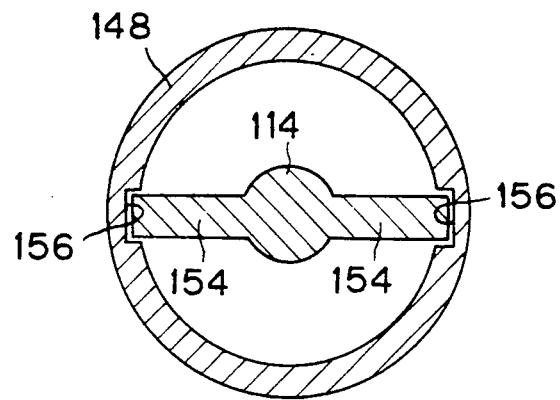
FIG. 7 is a cross-sectional view taken along line VII—VII of FIG. 6.

The gripping means 120 further includes a tubular holder 148 vertically movably mounted on the rotor 138. The tubular holder 148 includes a radially inwardly projecting upper support portion 150 having an internal thread 152 threaded with the external thread 142 of the rotor 138. With this construction, the holder 148 is vertically movable in response to rotation of the rotor 138. The seed holder 114 includes a pair of lateral projections 154 projecting radially outwardly in opposite directions from a lower end of the seed holder 114. As shown in FIG. 7, the lateral projections 154 are slidably received in keyways 156 which are formed in diametrically opposite portions of the inner peripheral surface of the tubular holder 148. The holder 148, as it is moved in a vertical direction, is not rotatable about its own axis.

A plurality of grip fingers 158 are pivoted by shafts 160 to a lower end of the holder 148 and project radially inwardly from the holder 148. The grip fingers 158 are circumferentially spaced at equal intervals. For a stable holding of the single crystal ingot, the number of the grip fingers 158 is preferably three. However, it is possible to use two or more than three grip fingers. The grip fingers 158 are allowed to pivotally move in an upward direction until the single crystal ingot assumes a substantially upstanding position. However, the downward pivotal movement of the grip fingers 158 exceeding a predetermined angular range is prevented by stoppers 162 projecting radially inwardly from the lower end of the tubular holder 148.

Figure 8:
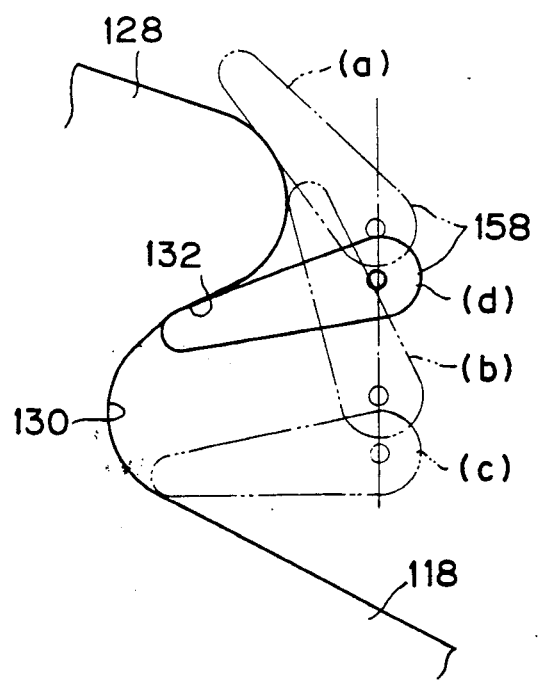
FIG. 8 is a diagrammatic view illustrative of the manner in which a cramp finger engages an engagement step on an upper part of a single crystal ingot.

Operation of the apparatus of the foregoing construction is described below. The tubular holder 148 is normally disposed on an upper standby position in which the rotor 138 is substantially concealed by the tubular holder 148. In this instance, the grip fingers 158 are retained on the corresponding stoppers 162. When the non-illustrated remote control commander is actuated to send a command signal to the receiver 146, the motor 140 is driven to rotate the rotor 138 in one direction relative to the pull shaft 136. In response to rotation of the rotor 140, the tubular holder 148 descends linearly along the rotor 140 as it is guided non-rotatably by sliding engagement between the lateral projections 154 of the seed holder 114 and the keyways 156 in the tubular holder 148. The downward movement of the tubular holder 148 causes the grip fingers 158 to first engage the head 128 of the single crystal ingot 118 being grown and then pivot upwardly as illustrated by the phantom line designated by (a) in FIG. 8. A further downward movement of the tubular holder 148 moves the grip fingers 158 from the tilted position indicated by the phantom lines (a) to a substantially upstanding position indicated by the phantom lines (b) in the same figure whereupon the grip fingers 158 clear the head 128 and pivot downwardly by their own weight to a substantially horizontal position illustrated by the phantom lines (c) where the grip fingers 158 engage the neck 130 of the single crystal ingot 118. Then, the remote control commander is actuated to rotate the motor 140 in the opposite direction to lift the tubular holder 148 to such an extent that the grip fingers 158 are brought into interlocking engagement with the engagement step 132 of the single crystal ingot 118, as illustrated by the phantom lines designated by (d) in FIG. 8. In this instance, the grip fingers 158 are retained on the stoppers 162 and capable of withstanding the weight of the single crystal ingot 118 without causing detachment of the single crystal ingot 118 from the grip fingers 158. Thereafter, the pulling means 122 is driven to gradually lift the single crystal ingot 118 grown by the CZ method.

Figure 9:
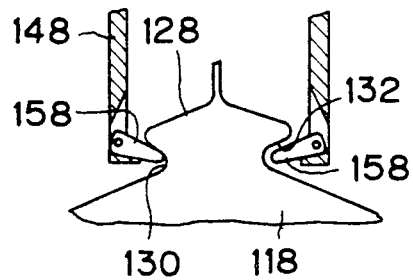
FIG. 9 is a fragmentary cross-sectional view of the apparatus shown in FIG. 8 as it is pulling a single crystal ingot having an upper end portion including an asymmetric engagement step.

During the formation of the engagement step 132, the head 128 and the neck 130 may be formed asymmetrically about a longitudinal axis of the single crystal ingot 118, as shown in FIG. 9. In this instance, the grip fingers 158 are no longer possible to uniformly grip the engagement portion 132. This means that the weight of the single crystal ingot 118 is retained only by a selected one or ones of the grip fingers 158. As a consequence, it occurs likely that the selected grip finger or fingers are damaged or broken due to uneven sharing of the load.

Figure 10:
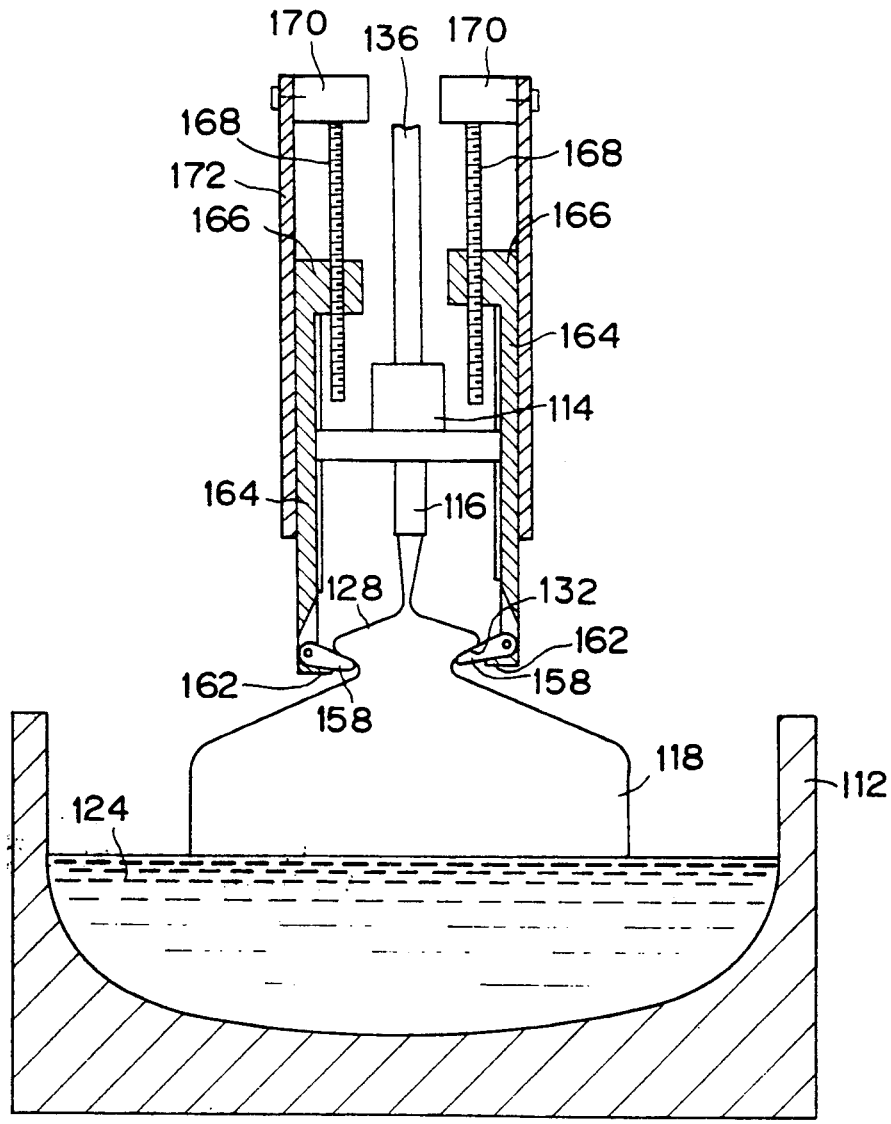
FIG. 10 is a diagrammatic cross-sectional view of a single crystal ingot producing apparatus according to a fourth embodiment of this invention.

The foregoing problem does not take place when a modified gripping means shown in FIG. 10 is used. The modified gripping means differs from the gripping means 120 of the first embodiment in that the grip fingers 158 are vertically movable independently from one another. To this end, the gripping means includes a plurality of vertical elongate holders 164 corresponding in number to the number of the grip fingers 158. The holders 164 are circumferentially spaced at equal intervals and disposed around the pull shaft 136. Each of the grip fingers 158 is pivoted to a lower end of a corresponding one of the holders 164 in the same manner as the grip fingers 158 of the third embodiment described above. Each holder 164 has a support portion 166 projecting laterally inwardly from an upper end of the holder 164. A vertical feed screw 168 is threaded through the support portion 166. The upper end of the feed screw 168 is coupled to a drive motor 170 which is secured to a tubular guide member 172. The tubular guide member 172 slidably receives therein the holders 164 while restricting radial outward movement of the holders 164. With this construction, the vertical holders 164 are vertically movable separately from one another when the corresponding drive motor 170 are driven. If an engagement step 132 which is formed on an upper part of the single crystal ingot 118 is irregular in shape as shown in FIG. 10, the grip finger 158 of the left holder 164 is held in interlocking engagement with a left part of the irregularly shaped engagement step 132, while the grip finger 158 of the right holder 164 is held out of engagement with a light part of the irregularly shaped engagement step 132. In this instance, the drive motor 170 associated with the right holder 164 is driven to rotate the corresponding feed screw 168 in a direction to pull the right holder 164 upwardly along the guide member 172 until the grip finger 158 of the right holder 164 engages the right part of the irregularly shaped engagement step 132. This adjustment of the vertical position of the holders 164 insures that the irregularly shaped engagement step 132 can be uniformly gripped by the grip fingers 158 of all holders 164. Then, the single crystal ingot 118 being grown is gradually pulled upwardly. With the gripping means having independently movable holders 164, a large-diameter, heavy single crystal ingot can be produced in safety even when an engagement step formed on an upper part of the single crystal ingot is irregular in shape.

Obviously, various modifications and variations of the present invention are possible in the light of the above teaching. It is therefore to be understood that within the scope of the appended claims the invention may be practiced in embodiments other than those specifically described.

What is claimed is:

1. An apparatus for producing a single crystal ingot grown from a seed crystal by Czochralski method, comprising:

means for forming a large-diameter head and a small-diameter neck in succession so as to provide a downwardly facing engagement step on an upper part of a single crystal ingot to be grown from the seed crystal; and means for gripping the upper part of the single crystal ingot being grown, said gripping means including a power-driven cylindrical rotor disposed vertically and having an external thread on its outer peripheral surface, a tubular holder having on its inner peripheral surface an internal thread threaded over the external thread, the tubular holder being non-rotatable and vertically movable in response to rotation of said rotor, a plurality of circumferentially spaced grip fingers pivotally connected to a lower end of the tubular holder and releasably engageable with the engagement portion of the single crystal ingot, and means for preventing the grip fingers from pivoting in a downward direction beyond a predetermined angular range.

2. An apparatus for producing a single crystal ingot grown from a seed crystal by Czochralski method, comprising:

means for forming a large-diameter head and a small-diameter neck in succession so as to provide a downwardly facing engagement step on an upper part of the single crystal ingot to be grown from the seed crystal;

means for gripping the upper part of the single crystal ingot being grown, the gripping means including a plurality of circumferentially spaced grip arms each having a grip finger releasably engageable with the upper part of the single crystal ingot, the grip arms being vertically movable to move respective grip fingers toward and away from each other and being vertically movable independent of one another;

means for holding said gripping means in a position for gripping the upper portion of the single crystal ingot reliably against detachment; and a seed holder for holding the seed crystal, said grip means further including a slide member vertically movably mounted on said seed holder and having a plurality of sliders slidable in a vertical direction, each of the grip arms being pivoted on a corresponding one of said sliders.

3. An apparatus according to claim 1, wherein the preventing means includes a plurality of stoppers projecting radially inwardly from a lower end of the tubular holder and engageable with corresponding ones of the grip fingers when the grip fingers pivot downward.

4. An apparatus according to claim 1, wherein the number of the plurality of grip fingers is three, the three grip fingers being circumferentially spaced at equal intervals.

5. An apparatus according to claim 1, wherein at least a distal end of each of the grip fingers is made of molybdenum.

6. An apparatus according to claim 1, further including an electric motor for rotating the rotor, and a receiver operatively connected to the motor for accepting infrared radiation signals or ultrasonic signals so as to control the operation of the motor.

7. An apparatus for producing a single crystal ingot grown from a seed crystal by Czochralski method, comprising:

means for forming a large-diameter head and a small-diameter neck in succession so as to provide a downwardly facing engagement step on an upper part of a single crystal ingot to be grown from the seed crystal; and means for gripping the upper part of the single crystal ingot being grown, said gripping means including a plurality of circumferentially spaced, vertical elongate holders each having a support portion, a plurality of grip fingers pivotally connected to lower ends of the holders, respectively, and releasably engageable with the upper part of the single crystal ingot, means for preventing said grip fingers from pivoting in a downward direction beyond a predetermined angular range, a plurality of power-driven feed screws threaded through said support portions of the respective holders and rotatable to move the corresponding holders in a vertical direction, and a tubular guide member slidably receiving therein said holders while restricting radial outward movement of the holders, said guide member supporting thereon said feed screws.

* * * * *